(12) United States Patent
Birner et al.

(10) Patent No.: US 8,492,229 B2
(45) Date of Patent: Jul. 23, 2013

(54) METHOD AND LAYOUT OF SEMICONDUCTOR DEVICE WITH REDUCED PARASITICS

(76) Inventors: Albert Birner, Regensburg (DE); Qiang Chen, Sollentuna (SE)

( * ) Notice: Subject to any disclaimer, the term of this patent is extended or adjusted under 35 U.S.C. 154(b) by 89 days.

(21) Appl. No.: 13/087,102

(22) Filed: Apr. 14, 2011

(65) Prior Publication Data

US 2011/0294273 A1 Dec. 1, 2011

Related U.S. Application Data

(62) Division of application No. 11/828,944, filed on Jul. 26, 2007, now Pat. No. 8,035,140.

(51) Int. Cl.
 *H01L 21/336* (2006.01)
(52) U.S. Cl.
 USPC ............ 438/279; 438/296; 257/E21.435; 257/E21.62
(58) Field of Classification Search
 USPC .......... 438/279, 296; 257/E21.435, E21.62
 See application file for complete search history.

(56) References Cited

U.S. PATENT DOCUMENTS

| | | | |
|---|---|---|---|
| 6,878,603 B2 * | 4/2005 | Bromberger et al. | 438/390 |
| 7,084,462 B1 | 8/2006 | Warnock et al. | |
| 7,119,399 B2 | 10/2006 | Ma et al. | |
| 2002/0145172 A1 | 10/2002 | Fujishima et al. | |
| 2005/0253175 A1 | 11/2005 | Taddiken | |
| 2007/0034942 A1 | 2/2007 | Xu et al. | |
| 2007/0034986 A1 | 2/2007 | Hokomoto et al. | |
| 2007/0194387 A1 * | 8/2007 | Dyer et al. | 257/369 |
| 2007/0228488 A1 * | 10/2007 | Kishii et al. | 257/374 |
| 2007/0228497 A1 | 10/2007 | Shimizu | |
| 2007/0243671 A1 * | 10/2007 | Liaw | 438/151 |

FOREIGN PATENT DOCUMENTS

DE 102 50 832 A1 5/2004

* cited by examiner

*Primary Examiner* — Matthew Landau
*Assistant Examiner* — Colleen E Snow
(74) *Attorney, Agent, or Firm* — Slater & Matsil, L.L.P.

(57) ABSTRACT

An semiconductor device is disclosed. The device includes a semiconductor body, a layer of insulating material disposed over the semiconductor body, and a region of gate electrode material disposed over the layer of insulating material. Also included are a source region adjacent to gate region and a drain region adjacent to the gate region. A gate connection is disposed over the semiconductor body, wherein the gate connection includes a region of gate electrode material electrically coupling a contact region to the gate electrode. An insulating region is disposed on the semiconductor body beneath the gate connection.

29 Claims, 9 Drawing Sheets

METHOD AND LAYOUT OF SEMICONDUCTOR DEVICE WITH REDUCED PARASITICS

This application is a divisional of U.S. application Ser. No. 11/828,944, entitled, "Method and Layout of Semiconductor Device with Reduced Parasitics," filed on Jul. 26, 2007 now U.S. Pat. No. 8,035,140, which application is hereby incorporated herein by reference in its entirety.

TECHNICAL FIELD

This invention relates generally to semiconductor devices, and more particularly to devices with reduced parasitics.

BACKGROUND

While semiconductor devices have been used in electronic devices such as computers and cellular phones, semiconductor devices are also increasingly used for high power and high frequency applications such as subscriber cable service transmission and cellular base station transmission. Therefore, one of the goals of the semiconductor industry is to develop semiconductor devices that operate at high frequencies as well as provide adequate power for data transmission applications.

One type of semiconductor device used for high power and high frequency applications is the power metal oxide field effect transistor (MOSFET). Of the various forms of power MOSFETs, the Lateral Double-Diffused Metal Oxide Semiconductor (LDMOS) device is commonly used because of its output power capability and high efficiency. Because of its high performance and efficiency, the LDMOS device has found its way into demanding applications such as cellular phone base stations and other transmission equipment.

As performance requirements have become more demanding, however, semiconductor device manufacturers must continually improve power transistor device performance. One limitation to power transistor device performance is parasitic capacitance. In power transistors, parasitic capacitance is particularly problematic because of the large device structures necessary to source and sink large currents, while avoiding breakdown at high voltages. As device size increases, parasitic capacitance contributors, such as source-substrate capacitance, drain-substrate capacitance, gate-drain capacitance, gate-source capacitance, and interconnect capacitance also increase.

Besides limiting device performance through the mere presence of capacitive loading, practical considerations in dealing with parasitic capacitance may also lead to higher resistive parasitics. For example, in order to maintain a minimum parasitic gate-source capacitance due to the presence of gate routing over the source, the number of gate contacts may have to be reduced. Such a reduction in the number of gate contacts results in a correspondingly higher series gate resistance.

In the field of highly efficient power transistors, device structures that minimize parasitic capacitance are needed.

SUMMARY OF THE INVENTION

In one embodiment of the present invention, a semiconductor device is provided. The device includes a layer of insulating material disposed over a semiconductor body, and a gate electrode disposed over the layer of insulating material. The gate electrode comprises a first region of gate electrode material having a length, width, a first end at an end of the length and a second end at end of the length opposite the first end. The device also includes a source region disposed within the semiconductor body adjacent to the first region of gate electrode material along the width of the first gate region of gate electrode material. Similarly, the device includes a drain region disposed within the semiconductor body adjacent to the first region of gate electrode material along the width of the first region of gate electrode material opposite the source region. A gate connection comprising a second region of gate electrode material that extends away from the width of the first gate region is provided. The gate connection is electrically coupled to a contact region and to a region of gate electrode material along the width of the first region of gate electrode material between the first and the second end. A first insulating region disposed beneath the gate connection.

The foregoing has outlined rather broadly features of the present invention. Additional features of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of preferred embodiments are discussed in detail below. It should be appreciated, however, that the present invention provides many applicable inventive concepts that may be embodied in a wide variety of specific contexts. The specific embodiments discussed are merely illustrative of specific ways to make and use the invention, and do not limit the scope of the invention.

The invention will now be described with respect to preferred embodiments in a specific context, namely a semiconductor device with reduced parasitics. Concepts of the invention can also be applied, however, to other electronic devices.

Figure 1A:
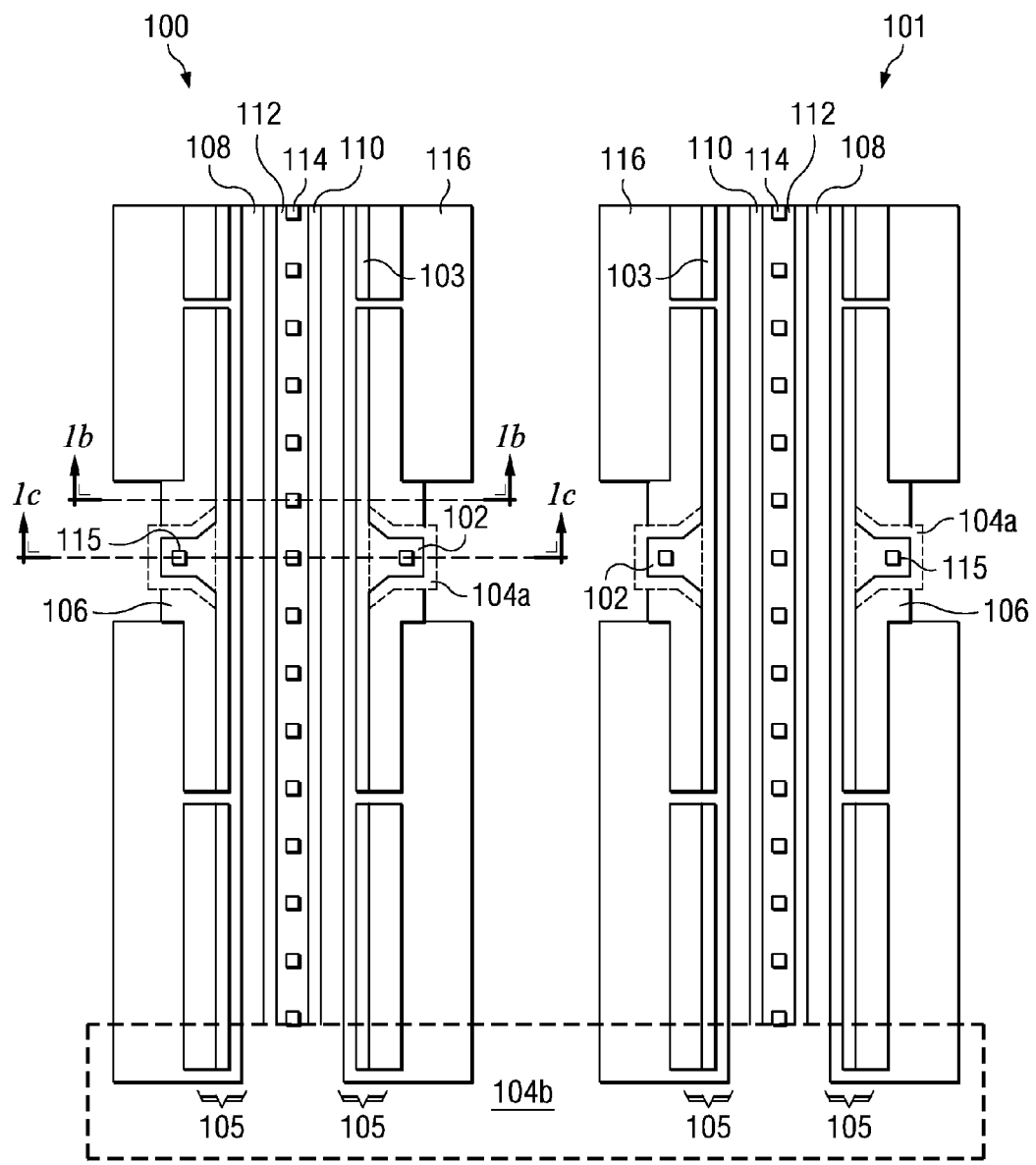
FIGS. 1a-1c illustrate a layout view and corresponding cross-sections of an embodiment of the present invention.

Referring first to FIG. 1a, a layout view of two symmetric LDMOS transistor pairs 100 and 101 is shown. In a preferred embodiment of the present invention, each transistor within LDMOS transistor pairs 100 and 101 includes a source region 106, a drain region 108, and a gate region 103. Each transistor pair 100 and 101 further includes shared common drain contacts 114, drain routing 112, and a doped drain contact region 110 that provides a low resistance electrical connection to drain regions 108.

Gate contacts 115 provide electrical coupling from a metallization layer (not shown) to the gate regions 103 of the devices. Gate regions 103 are coupled to gate contacts 115 by a region of gate electrode material 102 that is made from the same material as gate region 103. In a preferred embodiment of the present invention, field plate 116 is provided to shield gate region 103 from drain region 108, which reduces the amount of gate-drain capacitance. Excess gate-drain capacitance is undesirable in most common source LDMOS applications because of the Miller multiplication effect.

Figure 1B:
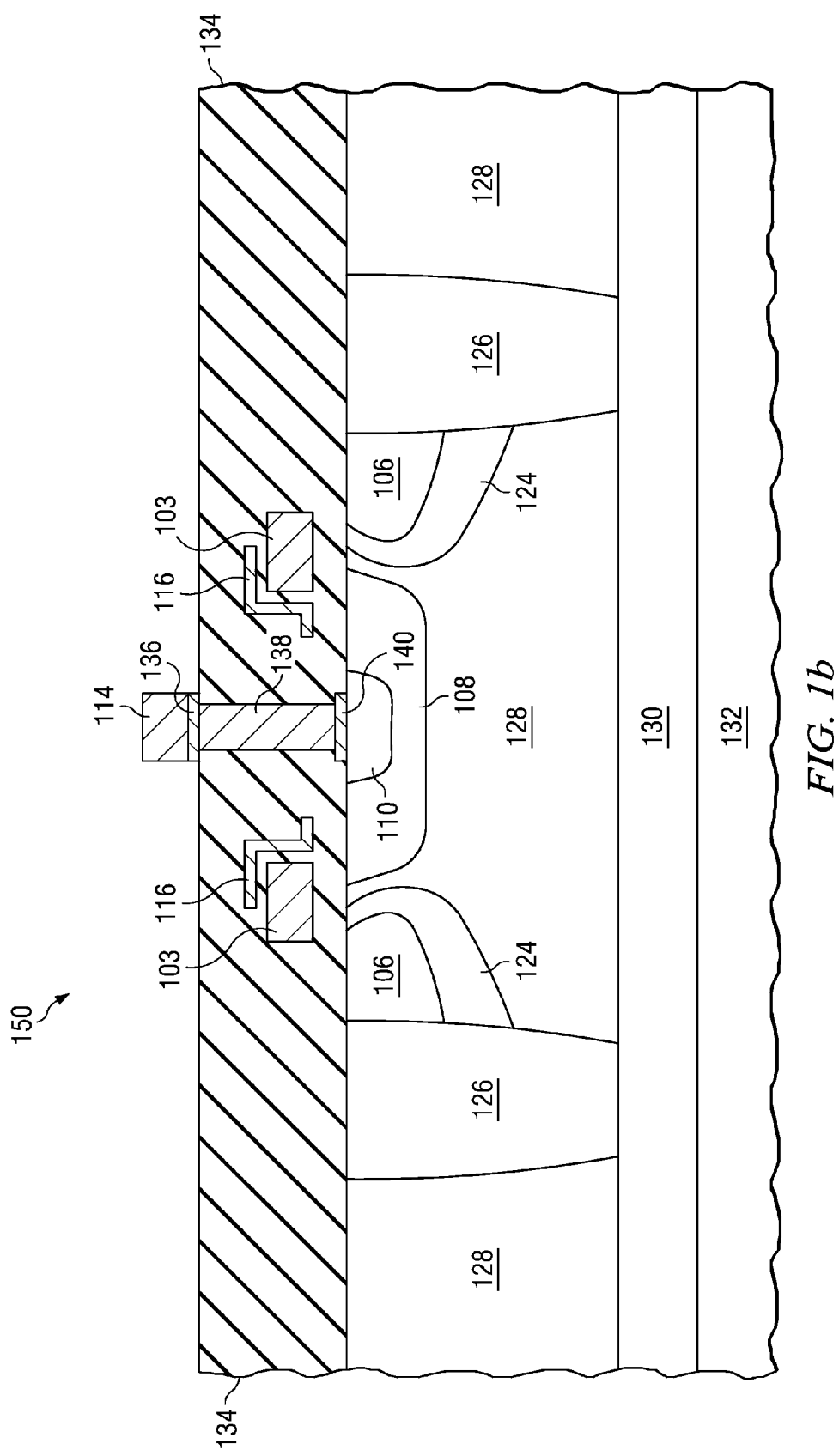

Turning to FIG. 1b, a cross section 150 taken at line 1b-1b of FIG. 1a is shown illustrating symmetric n-channel LDMOS transistor pair 100. In a preferred embodiment of the present invention, drain regions 108 are lightly doped n-type regions, and are electrically connected to a shared drain contact 114. Shared drain contact 114 is typically coupled to drain region 108 by a tungsten via 138 above doped drain contact region 110 and intervening barrier layers 136 and 140. In a preferred embodiment of the present invention, doped drain contact region 110 is doped at a higher concentration than drain region 108 to provide for a lower resistance connection to drain contact 114. The drain region 108 and drain contact region 110 are fabricated according to conventional techniques known in the art. In alternative embodiments of the present invention, the LDMOS device may be p-type, and consequently drain regions 108 would be p-type regions. In yet other alternative embodiments, non-lightly doped regions may be present, barrier layers 136 and 140 may not necessarily be present, drain regions 108 may or may not be shared, and other materials besides tungsten may be used in forming via 138.

Source regions 106 are preferably p-type regions disposed within p-well regions 124, which are disposed within a p-type epitaxial layer 128 at the surface of substrate 130. Source regions 106 are electrically coupled to metal layer 132 on the back side of the substrate 130 through an ion implanted p+ sinker 126 in series with substrate 130. In a preferred embodiment of the present invention, source regions 106 do not have contacts on the top surface of the top surface. Rather, the source connection is made though the back of the substrate. In a preferred embodiments of the present invention, substrate 130 is a low resistivity substrate, typically about 10 m Ω cm. Sinker 126 and epitaxial layer 128 can be fabricated using conventional methods. In alternative embodiments, however, contact to source region 106 can be made from the topside of substrate 130 rather than from the bottom of substrate 130. In yet other embodiments of the present invention, source regions 106, well regions 124, and possibly epitaxial layer 128 can be made from n-type material in order to create a p-type LDMOS device.

Gate regions 103 disposed within oxide layer 134 are preferably made from polysilicon using conventional methods. In some preferred embodiments this gate can be a two-layer gate including a polysilicon layer on the bottom and a titanium silicide layer on top, although in other embodiments of the present invention, other materials may be used. For example, cobalt silicide, nickel silicide, and tungsten silicide can be used. In other embodiments of the present invention, a polysilicon/tungsten nitride/tungsten gate stack can be used which utilizes non-silicided gate materials. Titanium silicide, however, is a preferred material for the fabrication of power devices. Field plate 116 is preferably formed adjacent to gate region 103 in order to shield gate region 103 from drain region 108 and via 138. Field plate 116 is preferably made from metal and is formed using conventional methods. In alternative embodiments of the present invention, however, field plate 116 may be omitted.

Figure 1C:
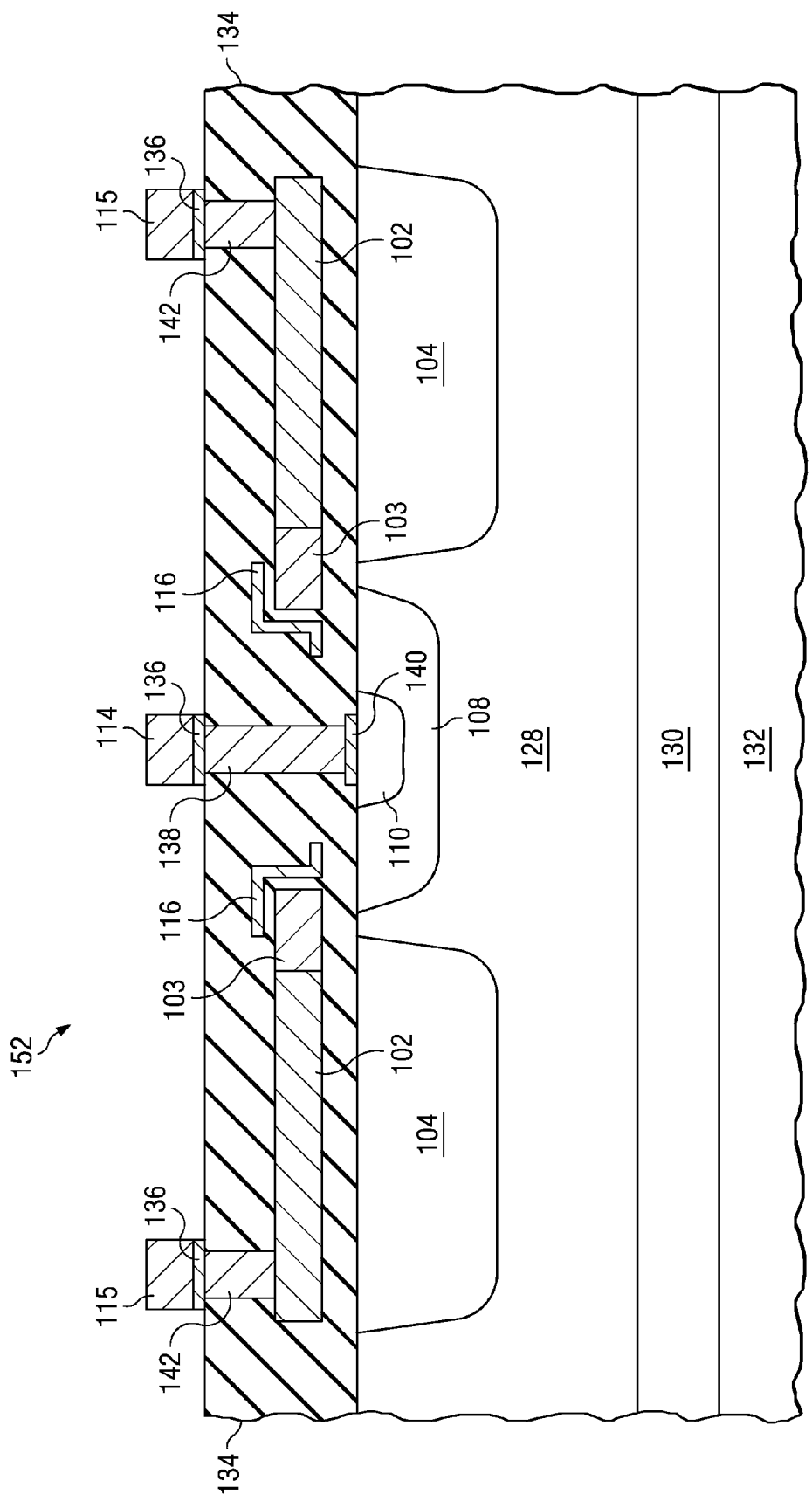

Turning to FIG. 1c, a cross-section 152 taken at line 1c-1c of FIG. 1a is shown illustrating symmetric LDMOS transistor pair 100. The cross-section shows gate region 103 electrically coupled to gate contact 115 through via 142, barrier layer 136 and gate connection region 102. In a preferred embodiment of the present invention, via 142 is made from tungsten, and gate connection region102 is formed from the same materials as gate region 103 as described herein above using conventional methods. In alternative embodiments of the present invention, other materials may be used.

In the conventional LDMOS devices, gate connection region 102 would overlie source regions 106 creating excess gate-source capacitance. In the preferred embodiment of the present invention, however, STI regions 104 are formed underneath gate connection region 102. The presence of STI region 104 (region 104a in FIG. 1a) reduces the gate-source capacitance compared to a conventional embodiment. In conventional embodiments, the number of gate contacts are typically limited by the maximum level of tolerable gate-source capacitance. Excess gate-source capacitance limits the high frequency performance of the LDMOS device. By reducing the gate-source capacitance in the manner described hereinabove, more gate connection regions 102 can be provided for a given maximum gate-source capacitance. As a result of having more gate connection regions 102 in parallel, the overall series input resistance for a given parasitic input capacitance will be reduced, thereby improving both the high frequency performance of the LDMOS device as well as the noise performance.

In a preferred embodiment of the present invention, STI regions 104 are trenches filled with high-density plasma oxide at a depth of about between about 200 nm and about 1000 nm, preferably 300 nm to 700 nm, using conventional methods. Because STI regions 104 contain insulating material, they present a much higher impedance to any adjoining semiconductor region or metal layer than epitaxial layer 128 or substrate 130. As a result of its higher impedance, STI regions 104 present a lower capacitive load than epitaxial layer 128 or substrate 130. In alternate embodiments of the present invention, other materials and other depths may be used.

In order to further reduce parasitic capacitance, such as drain-substrate, source-substrate, and gate-substrate capacitance, STI region 104b of FIG. 1a is formed against the ends of the device. The presence of STI region 104b places source region 106 and drain region 108 adjacent to an STI region rather than adjacent to epitaxial region 128 as typically done in the conventional designs. Consequently, capacitance from source region 106 and drain region 108 to the epitaxial region 128 is lower than a corresponding conventional structure. By disposing gate overhang regions 105 over STI region 104b instead of over a epitaxial region 128, parasitic gate-substrate capacitance is further reduced compared to conventional designs.

Figure 2A:
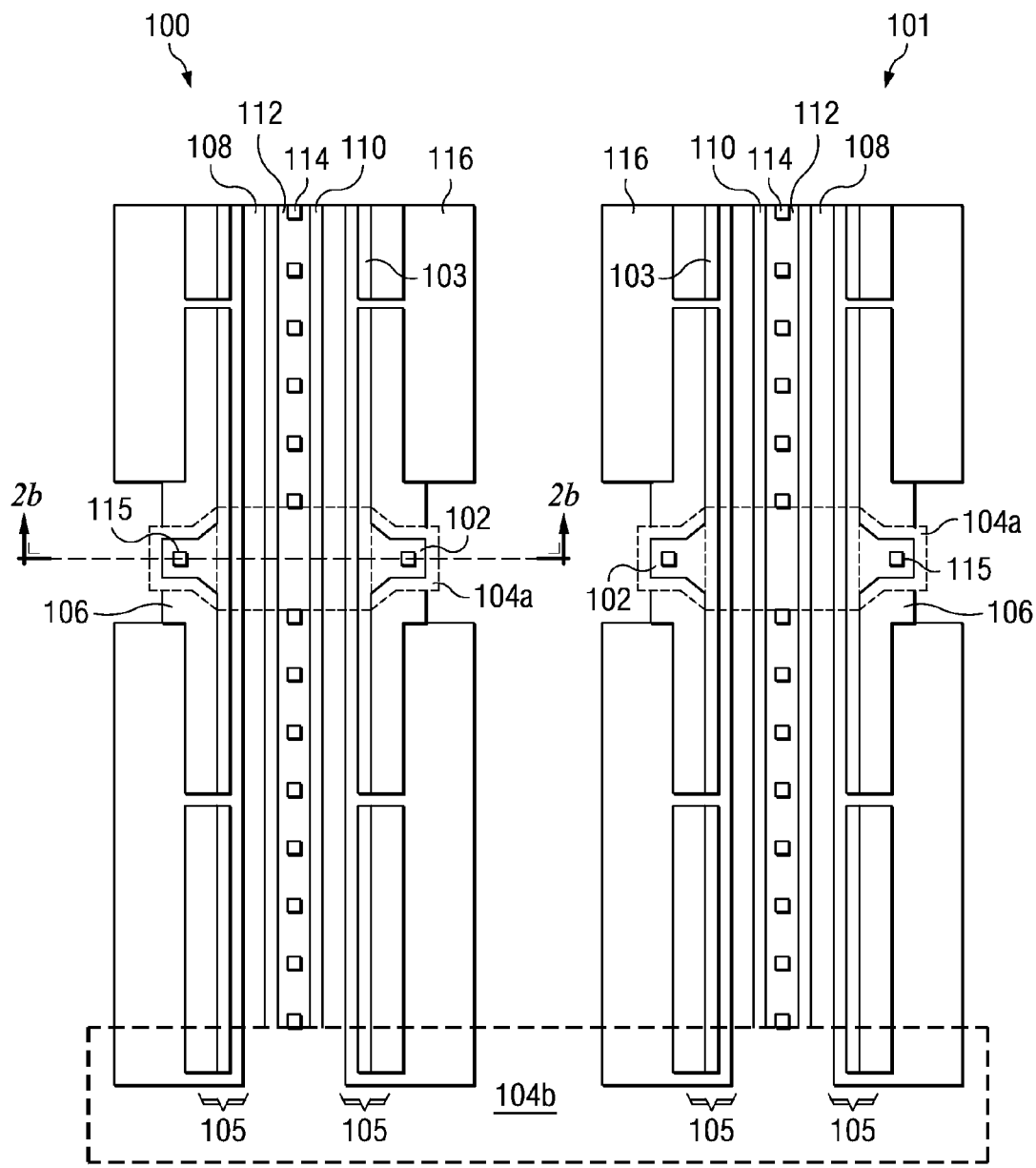
FIGS. 2a-2b illustrate a layout view and corresponding cross-sections of an alternate embodiment of the present invention.

Turning to FIG. 2a, a layout view of another preferred embodiment of the present invention is shown. This embodiment of the present invention is similar to the embodiment shown in FIG. 1a-1c, except that STI regions 104a on opposite sides of device pairs 100 and 101 are joined together such that STI regions 104a bisect device pairs 100 and 101. This extension of STI regions 104a partially isolates drain regions 108 from the possibility of increased gate-drain capacitance from gate connection region 102.

Figure 2B:
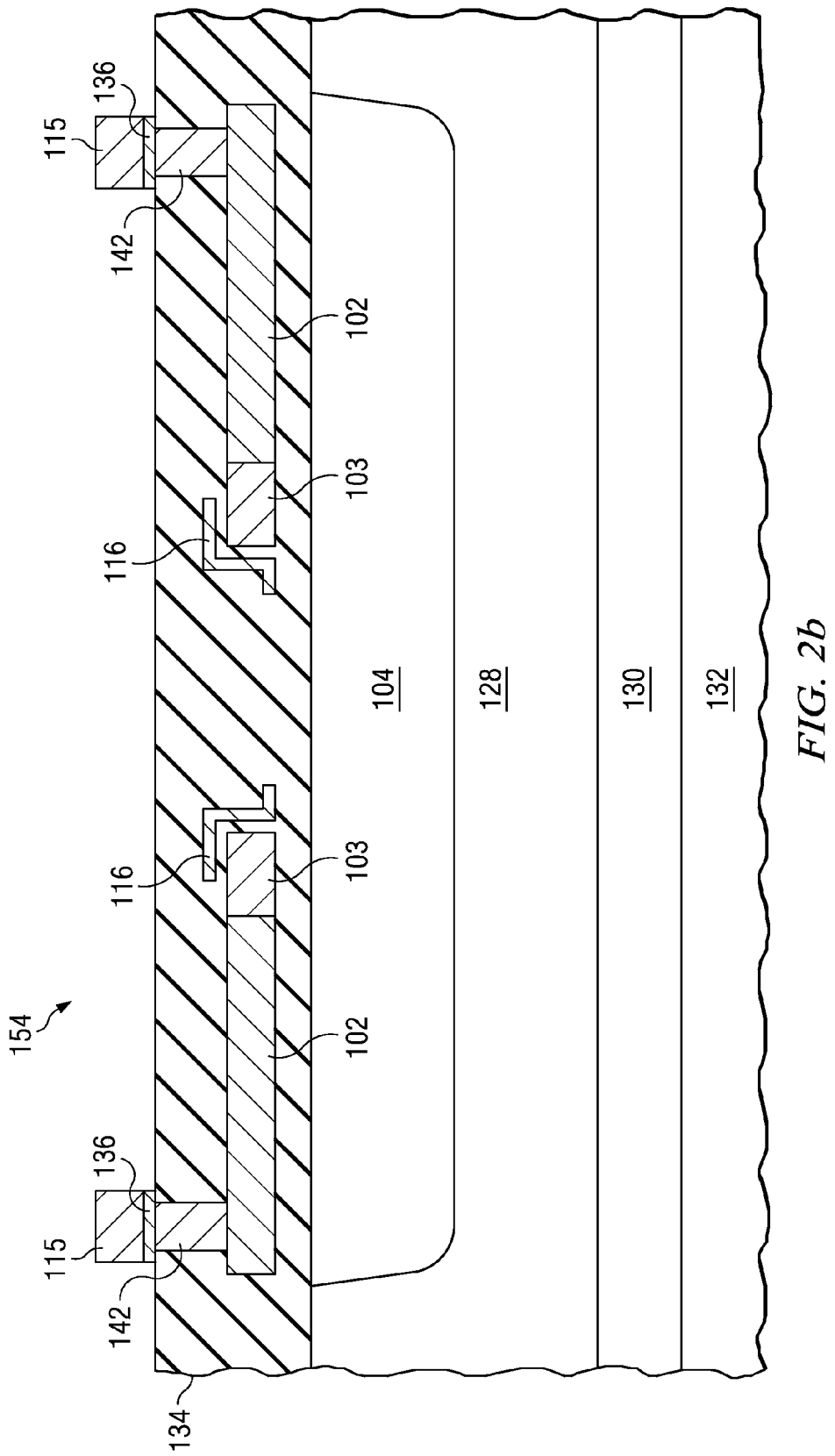

FIG. 2b shows a cross-sectional view of a preferred embodiment of device pair 154 taken at cross-sectional line 2b-2b of FIG. 2a. As shown, STI region 104 underlies gate connection regions 102, gate regions 103, field plates 116, and oxide region 134 between gate regions 103. STI region 104 presents a lower capacitive load to gate connection regions 102 and gate regions 103 than to source regions 108 (see FIG. 2a).

Figure 3A:
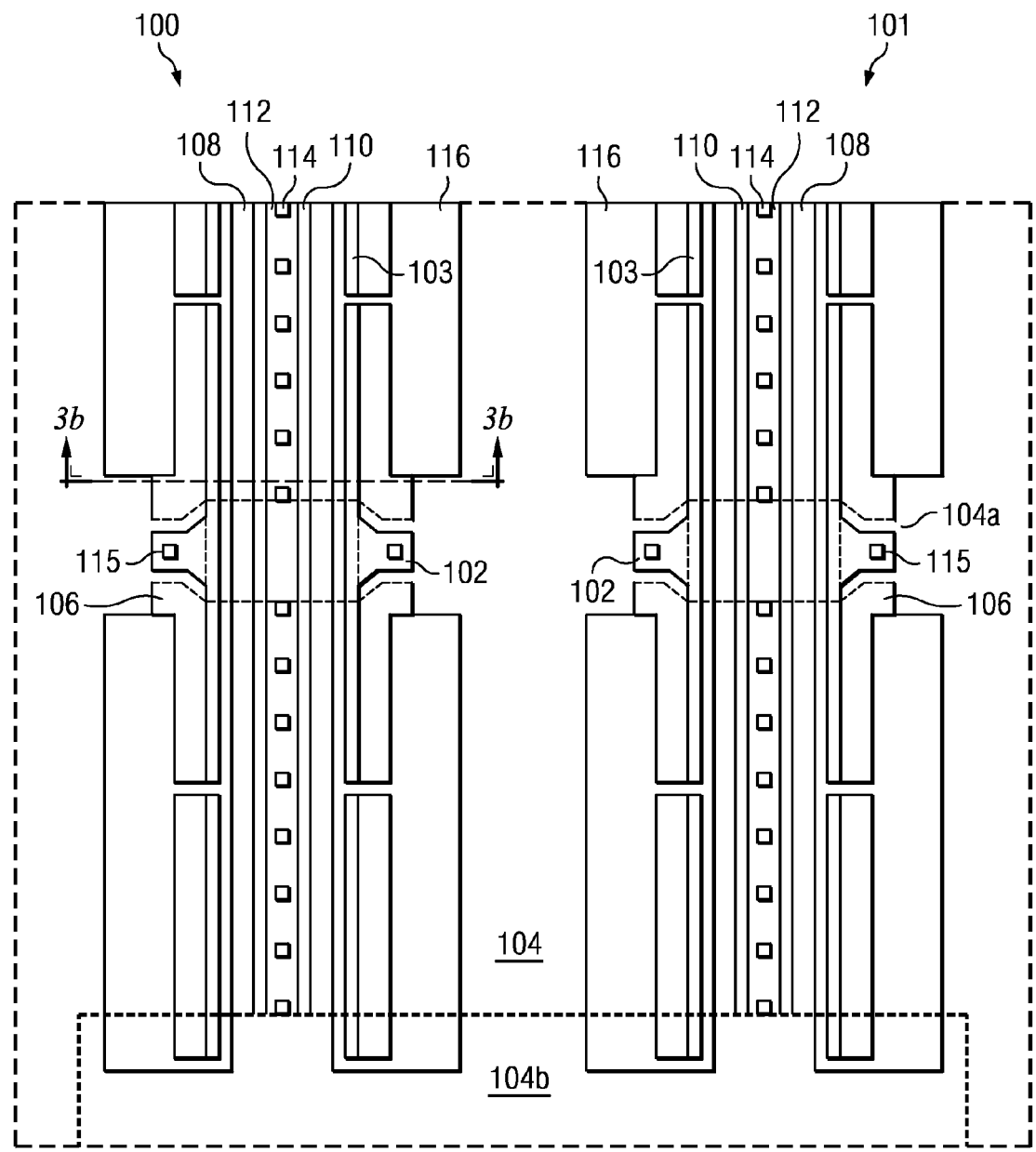
FIGS. 3a-3b illustrate a layout view and corresponding cross-sections of another embodiment of the present invention.

Turning to FIG. 3a, a layout view of another preferred embodiment of the present invention is shown. This embodiment of the present invention is similar to the embodiment shown in FIGS. 2a-2b, with the addition of STI regions 104 surrounding device pairs 101 and 102. By surrounding device pairs 100 and 102 with STI regions 104, sidewalls of source regions 106 and a source contact (not shown) exposed to epitaxial layer 128 (see FIG. 3b) are isolated and presented with a lower capacitive load, therefore resulting in a lower source-substrate parasitic capacitance than would be achievable in conventional designs.

Figure 3B:
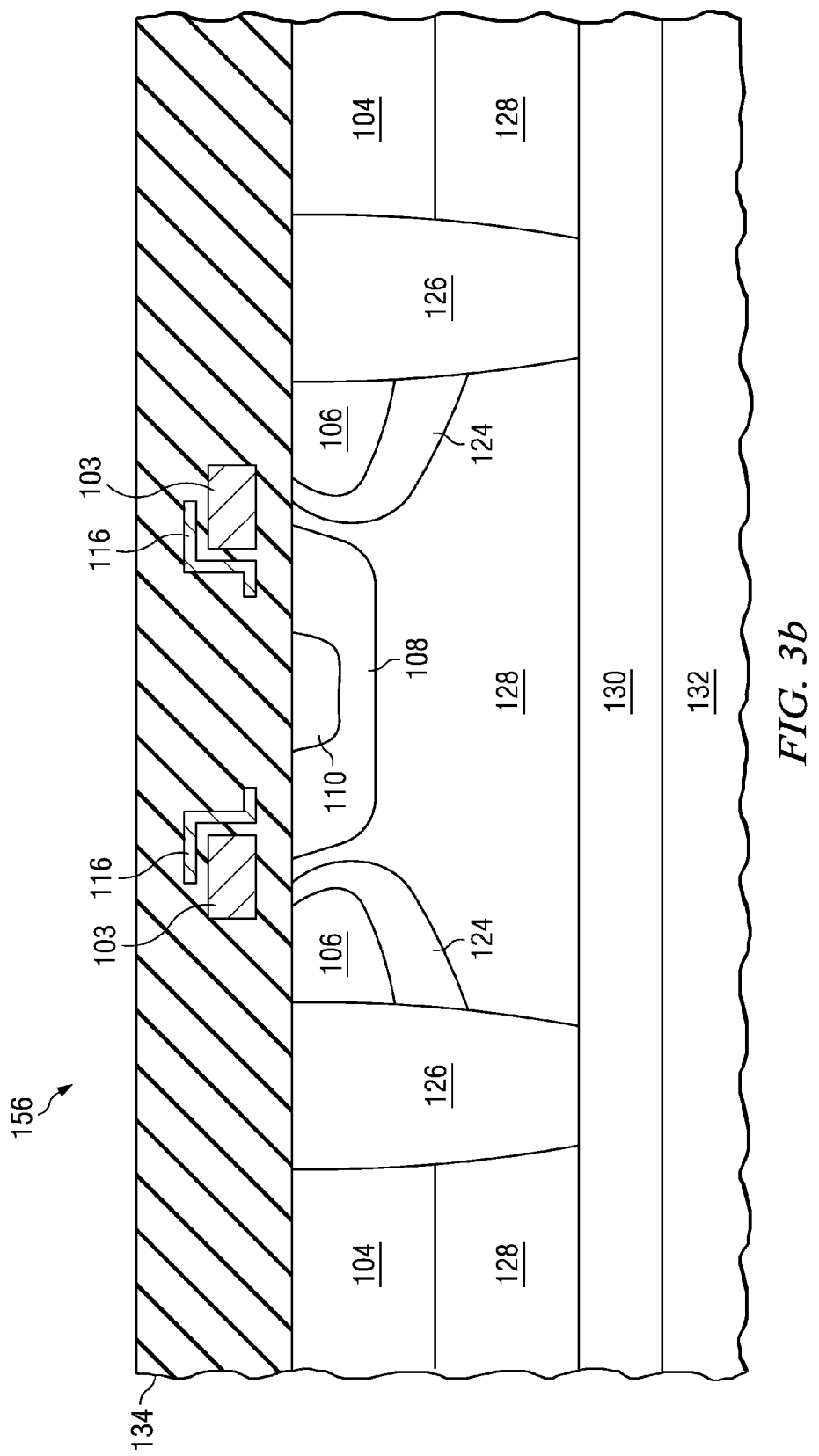

FIG. 3b shows a cross-sectional view of this preferred embodiment of device pair 156 taken at cross-sectional line 3b-3b of FIG. 3a. As is shown, STI region 104 is adjacent to source contact sinker 126. In alternative embodiments that do not utilize a source contact sinker 126, STI region 104 can be placed directly adjacent to source regions 106 and/or well regions 124.

Figure 4A:
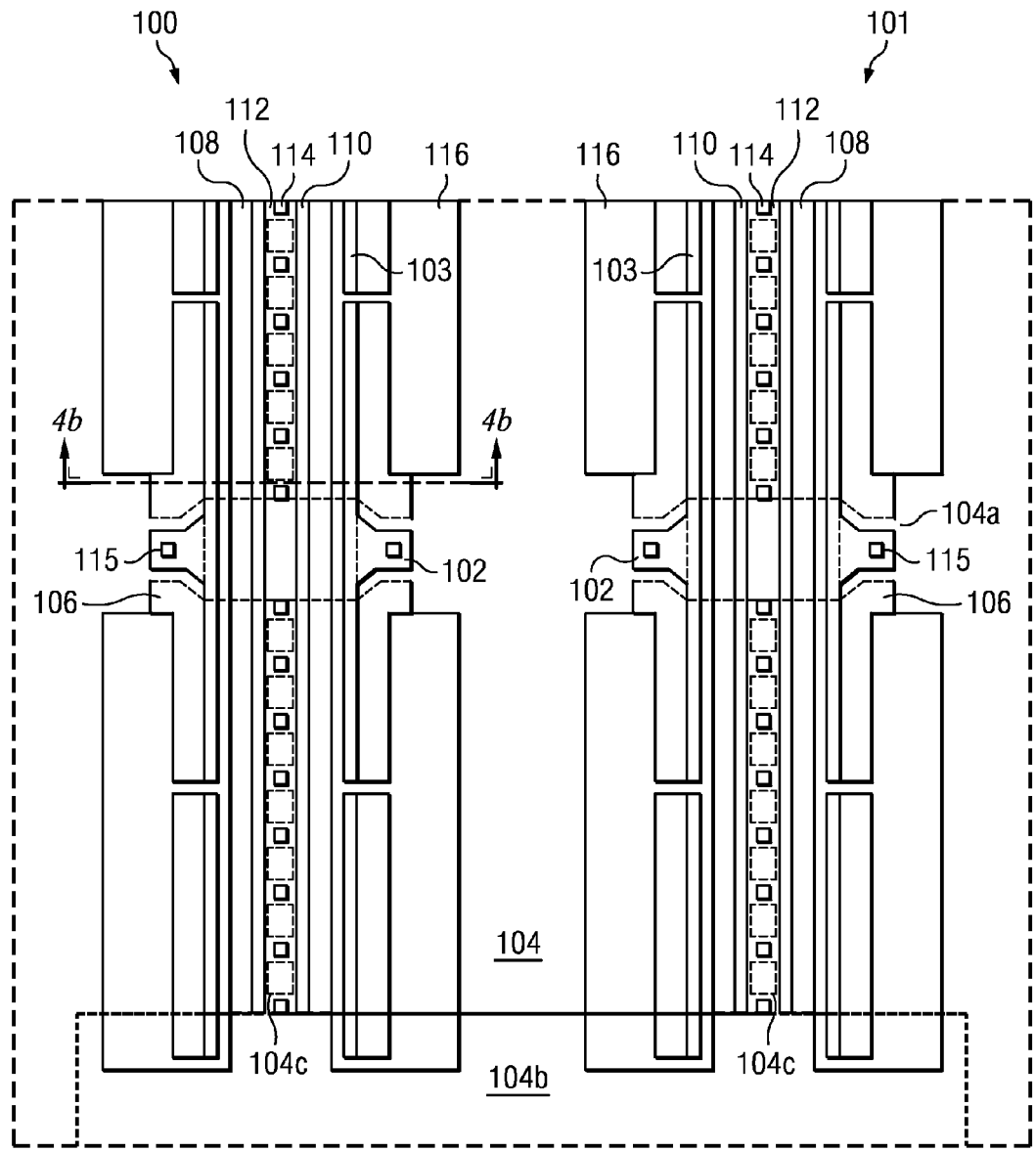
FIGS. 4a-4b illustrate a layout view and corresponding cross-sections of an additional embodiment of the present invention.

Turning to FIG. 4a, a layout view of yet another preferred embodiment of the present invention is shown. This embodiment is similar to the embodiment shown in FIGS. 3a-3b, with the addition of STI regions 104c placed between drain contacts 114. The placement of STI regions 104c reduces the surface area of the drain contact region 110 exposed to epitaxial layer 128 (FIG. 4b) beneath the LDMOS device pairs 100 and 101, thereby reducing parasitic drain-substrate capacitance. In alternative embodiments that do not have epitaxial layer 128, STI regions 104c reduce the capacitance of drain regions 108 to substrate 130 (see FIG. 4b).

Figure 4B:
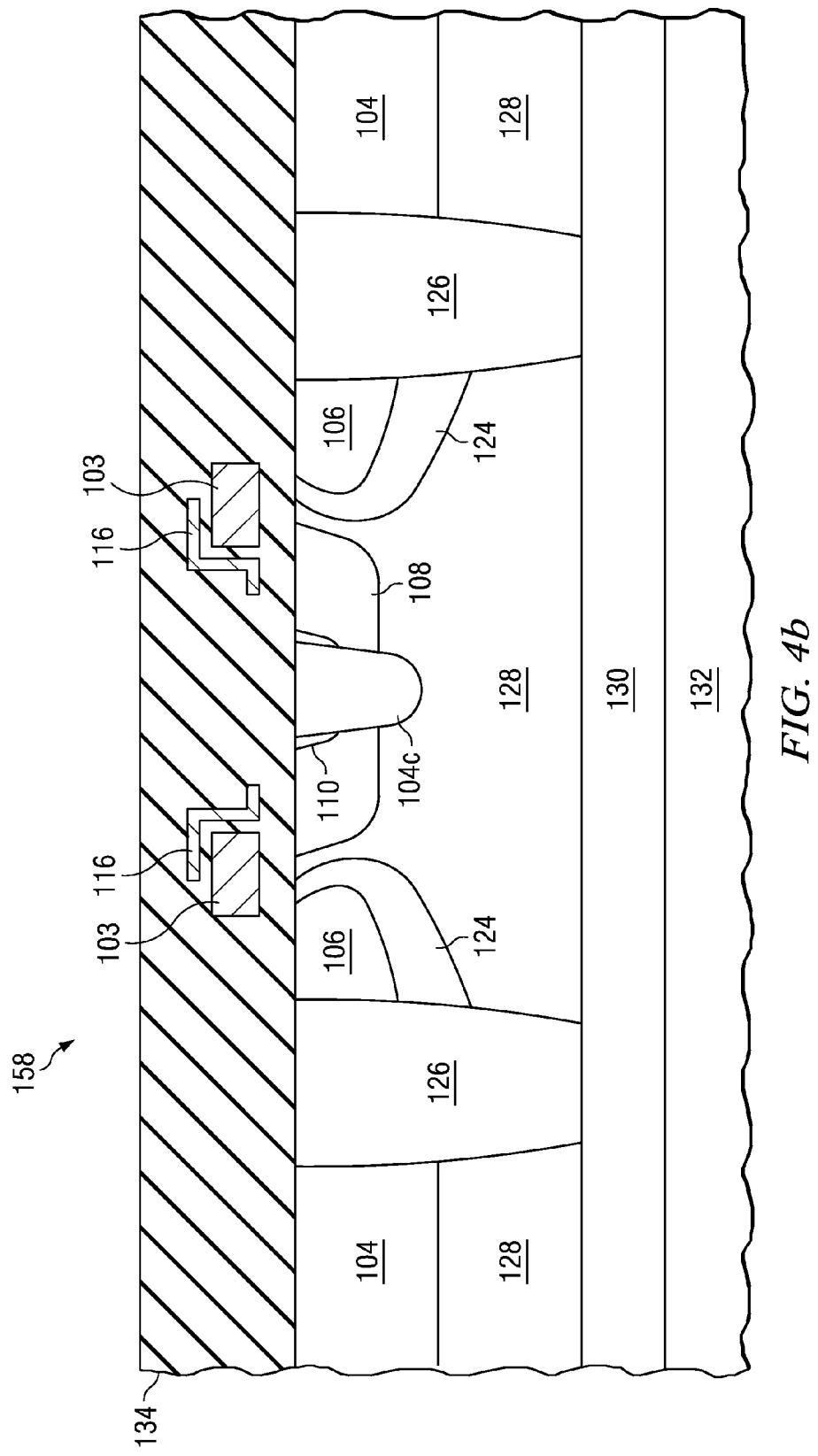

FIG. 4b shows a cross-sectional view of this preferred embodiment of device pair 158 taken at cross-sectional line 4b-4b of FIG. 4a. STI region 104c is shown within drain region 108. STI region 104 is adjacent to source contact sinker 126. In alternative embodiments that do not utilize a source contact sinker 126, STI region 104 can be placed directly adjacent to source regions 106 and/or well regions 124. Alternatively, in other embodiments, STI regions 104 adjacent to source contact sinkers 126 can be omitted.

Returning to FIG. 1c, fabrication of STI regions 104 according to preferred embodiments of the present invention is typically performed after epitaxial layer 128 is created. First, a chemical mechanical polishing (CMP) stop layer is deposited over the surface of epitaxial layer 128. In alternative embodiments without epitaxial layer 128, the CMP stop layer is deposited directly on the surface of substrate 130. According to a preferred embodiment, the CMP stop layer includes a 5 nm $SiO_2$ layer overlying substrate 130, on top of which a 200 nm $Si_3N_4$ layer is deposited. Next, a trench hard mask is deposited on top of the CMP stop layer. This hard mask is typically made from BPSG and deposited to a thickness of about 500 nm.

Resist is deposited over the hard mask and exposed lithographically according to a mask pattern. In a preferred embodiment of the present invention, the mask pattern defines the location of STI trenches 104 located according to the embodiments of the invention described hereinabove. Once the resist is exposed, the BPSG hard mask is etched and the resist is stripped using conventional techniques.

Using the BPSG hard mask, trenches in STI regions 104 are etched to a depth of between about 300 nm and about 700 nm. In other embodiments, the trench depth is preferably between about 200 nm and about 1000 nm. The opened silicon then undergoes a thermal oxidation step. Because STI regions 104 underlie regions of gate material, for example, under gate connections 102 the trenches 104 are filled with oxide using an HDP process. The HDP oxide deposition process is preferable compared to a conventional embodiment of LOCOS isolation for power devices to avoid the problem of SiN becoming embedded into the oxide, as is the case with thermally grown oxide used in conventional embodiments. The existence of such SiN particles underneath gate 103 is typically undesirable because it can lead to gate oxide failure by a mechanism known in the art as the Kooi effect. In alternative embodiments of the present invention, however, other processes besides HDP can be used which can create an oxide that promotes gate oxide reliability. For example, a low pressure chemical vapor deposition (LPCVD) of tetraethyl orthosilicate (TEOS) followed by a densification step can be used in place of HDP in other embodiments.

After the trenches in STI regions 104 are filled with oxide, a reactive ion etch (RIE) is used to remove oxide in non-STI regions in order to facilitate subsequent planarization. A CMP is then performed to remove most of the oxide (approximately 70%) from the surface of the stopping layer. Next, an oxide recess step, such as a deglaze, is performed to adjust the step height of STI regions 104 followed by a hot phosphoric acid etch of the $Si_3N_4$ pad nitride. A sacrificial oxide step is performed followed by the deposition of the gate oxide. The fabrication process then continues with the creation of the LDMOS devices, as hereinbefore described according to conventional techniques.

It will also be readily understood by those skilled in the art that materials and methods may be varied while remaining within the scope of the present invention. It is also appreciated that the present invention provides many applicable inventive concepts other than the specific contexts used to illustrate preferred embodiments. Accordingly, the appended claims are intended to include within their scope such processes, machines, manufacture, compositions of matter, means, methods, or steps.

What is claimed is:

1. A method for forming a semiconductor device, the method comprising:
    forming an STI region within a semiconductor body;
    forming a drain region within the semiconductor body adjacent a channel region, wherein the forming the drain region comprises doping a region of the semiconductor body;
    forming a source region within the semiconductor body adjacent the channel region opposite the drain region, wherein the STI region bisects the source region, and wherein the forming the source region comprises doping the semiconductor body;
    forming a gate region over the channel region, the gate region extending along a first direction substantially perpendicular to a current flow direction, wherein the forming the gate region comprises forming a gate dielectric over the channel region, and then forming gate electrode material over the gate dielectric; and
    forming a gate connection region over the STI region, wherein the forming the gate connection region comprises depositing gate electrode material over the STI region, wherein the gate connection region electrically couples to the gate region and extends away from the gate region along a second direction substantially perpendicular to the first direction, and wherein the STI region is disposed substantially beneath the entire gate connection region.

2. The method of claim 1, wherein the forming the STI region comprises:
   forming a CMP stop layer over a surface of the semiconductor body;
   depositing a hard mask over the CMP stop layer;
   depositing resist over the hard mask;
   exposing the hard mask lithographically to a mask pattern, wherein the mask pattern defines a location of the STI region;
   etching the hard mask, wherein a portion of the hard mask overlying the location of the STI region is removed;
   etching a trench in the semiconductor body at the STI region;
   filling the trench with an oxide;
   performing a CMP to remove oxide from the surface of the semiconductor body; and
   adjusting a step height of the STI region.

3. The method of claim 2, wherein:
   etching the trench comprises etching the trench to a depth of between about 200 nm and 1000 nm;
   filling the trench with oxide comprises using an HDP process; and
   adjusting the step height of the STI region comprises performing an oxide recess step.

4. The method of claim 3, wherein etching the trench comprises etching the trench to a depth of between about 300 nm and 700 nm.

5. The method of claim 1, further comprising forming a contact over the gate connection region.

6. The method of claim 1, further comprising forming drain contact regions within the drain region, the drain contact regions comprising doped regions having a higher doping concentration than the drain region.

7. The method of claim 6, further comprising forming insulating regions between the drain contact regions.

8. The method of claim 1, further comprising forming a field plate over a portion of the gate electrode material in the gate region.

9. The method of claim 1, wherein:
   the source region, gate region and drain region form a semiconductor device; and
   the method further comprises forming a second STI region adjacent to an edge of the source region of the semiconductor device.

10. The method of claim 9, wherein forming the second STI region comprises forming the second STI region to extend to an edge of a second semiconductor device.

11. A method of forming a semiconductor device, the method comprising:
   forming a drain region disposed within a semiconductor body;
   forming a plurality of gate regions disposed over the semiconductor body, the plurality of gate regions disposed on opposite sides of the drain region along a width of the drain region, the gate region having a length, width, first end and second end opposite the first end, wherein the gate regions comprise gate electrode material;
   forming a plurality of source regions disposed within the semiconductor body, each of the plurality of source regions disposed adjacent to a gate region along a width of the gate region; and
   forming a plurality of gate contact regions disposed over the semiconductor body adjacent to each source region, wherein forming each gate contact region comprises:
      forming a connection region of gate electrode material electrically coupled to and extending away substantially perpendicularly from one of the plurality of gate regions, at a location between the first end and the second end,
      forming a contact disposed over a portion of the connection region, and
      forming a first insulating region disposed on the semiconductor body beneath the connection region; and
      wherein
         at least two gate contact regions are formed on opposite sides of the semiconductor device adjacent to widths of the source region, and
         the first insulating region in each of the at least two gate contact regions is formed to be connected to each other by a joining insulating region, the joining insulating region bisecting the drain region and channel regions between the at least two gate contact regions.

12. The method of claim 11, further comprising forming a second insulating region disposed on the semiconductor body adjacent to ends of the source regions, the gate regions and the drain region, wherein the second insulating region extends along lengths of the source regions and a lengths of the drain region, wherein the second insulating region extends beneath portions of the gate regions extending past the source region and the drain region.

13. The method of claim 12, further comprising:
   forming a plurality of drain contact regions, wherein forming each drain contact region comprises forming:
      a doped region disposed within the drain regions, and
      a contact disposed over the doped region, wherein the doped region electrically couples the contact to the drain region;
   forming a plurality of third insulating regions disposed on the semiconductor body between the plurality of drain contact regions; and
   forming a fourth insulating region adjacent to an edge of the semiconductor device, the fourth insulating region extending to an edge of an adjacent semiconductor device, wherein the insulating region adjacent an edge of the device is adjacent to the edge of the semiconductor device along a width of the source region.

14. The method of claim 11, further comprising forming a second insulating region adjacent an edge of the semiconductor device, the second insulating region extending to an edge of an adjacent semiconductor device.

15. The method of claim 14, wherein forming the second insulating region adjacent to an edge of the semiconductor device comprises forming the second insulating region adjacent to the edge of the semiconductor device along a width of the source region.

16. The method of claim 11, further comprising:
   a plurality of drain contact regions, wherein each drain contact region comprises:
      a doped region disposed within the drain regions, and
      a contact disposed over the doped region, wherein the doped region electrically couples the contact to the drain region.

17. A method of forming an LDMOS device pair on a semiconductor body of a first conductivity type, the method comprising:
forming a shared drain region on the semiconductor body, forming the shared drain region comprising forming a highly doped drain contact region disposed within a lightly doped drain region, the shared drain region being of a second conductivity type opposite the first conductivity type,
forming a plurality of gate regions disposed adjacent to the shared drain region, forming each of the plurality of gate regions comprising forming a gate dielectric disposed on the semiconductor body and forming a gate electrode disposed over the gate dielectric, wherein each gate region defines a channel region below each gate region,
forming a plurality of field plate regions disposed over at least a portion of each gate region, wherein the field plate electrically shields the gate region from a portion of the shared drain region,
forming a plurality of source regions disposed adjacent to each gate region opposite the shared drain region, wherein the source region comprising a doped region of the second conductivity type, and
forming gate connection regions adjacent to the plurality gate regions, each gate connection regions being formed over a gate connection shallow trench isolation (STI) region disposed in the semiconductor body, wherein
each gate connection region is electrically coupled at least one of the gate regions, and
the gate connection region is physically coupled to a portion of the gate region along a width of the gate region and extends away substantially perpendicular from the portion of the gate region; and
forming a surrounding STI region surrounding the LDMOS device pair.

18. The method of claim 17, wherein:
forming the forming the gate electrode disposed over the gate dielectric comprises forming the gate electrode from polysilicon; and
forming the gate connection regions comprises forming the gate connection regions from polysilicon.

19. The method of claim 17, further comprising forming a sinker of the second conductivity type, the sinker electrically coupling one of the plurality of source regions to a semiconductor substrate.

20. The method of claim 17, wherein the first conductivity type is p-type and the second conductivity type is n-type.

21. A method of forming a Lateral Double-Diffused Metal Oxide Semiconductor (LDMOS) device, the method comprising:
forming a layer of insulating material disposed over a semiconductor body;
forming a gate electrode of the LDMOS device disposed within the layer of insulating material, the gate electrode comprising a first region of gate electrode material having a length, a width, a first end at an end of the length and a second end at end of the length opposite the first end;
forming a source region disposed within the semiconductor body, the source region adjacent the first region of gate electrode material along the width of the first region of gate electrode material;
forming a drain region disposed within the semiconductor body, the drain region adjacent the first region of gate electrode material along the width of the first region of gate electrode material opposite the source region;
forming a gate connection comprising a second region of gate electrode material that extends away substantially perpendicularly from the width of the first region of gate electrode material and is electrically coupled to a contact region, wherein the second region of gate electrode material couples to the first region of gate electrode material along the width of the first region of gate electrode material between the first and the second end; and
forming a first insulating region disposed beneath substantially the entire gate connection.

22. The method of claim 21, further comprising forming a second insulating region disposed within the semiconductor body adjacent to an end of the source region, the first region of gate electrode material, and the source region, wherein the second insulating region extends along a length of the source region, and wherein the second insulating region extends underneath a portion of the first region of gate electrode material extending past the source region and the drain region.

23. The method of claim 21, further comprising:
forming a plurality of drain contact regions, wherein forming each drain contact region comprises:
forming a doped region disposed within the drain region, and
forming a contact disposed over the drain region, wherein the doped region electrically couples the contact to the drain region; and
forming a plurality of third insulating regions disposed on the semiconductor body between the plurality of drain contact regions.

24. The method of claim 21, further comprising forming a second insulating region adjacent to an edge of the semiconductor device, the second insulating region extending to an edge of an adjacent semiconductor device.

25. The method of claim 24, wherein the second insulating region is adjacent to the edge of the semiconductor device along a length of the source region.

26. The method of claim 21, further comprising:
forming a second insulating region disposed within the semiconductor body adjacent to an end of the source region, the first region of gate electrode material, and the source region, wherein the second insulating region extends along a length of the source, and wherein the second insulating region extends underneath a portion of the first region of gate electrode material extending past the source region and the drain region;
forming a plurality of drain contact regions, wherein forming each drain contact region comprises:
forming a doped region disposed within the drain region, and
forming a contact disposed over the drain region, wherein the doped region electrically couples the contact to the drain region; and
forming a plurality of third insulating regions disposed on the semiconductor body between the plurality of drain contact regions.

27. The method of claim 26, further comprising:
forming a field plate disposed over a portion of the gate electrode; and
forming an epitaxial layer disposed on the semiconductor body.

28. The method of claim 27, further comprising forming a fourth insulating region adjacent to an edge of the semiconductor device, the fourth insulating region extending to an edge of an adjacent semiconductor device.

29. The method of claim 28, wherein forming the fourth insulating region comprises forming the fourth insulating region adjacent to the edge of the semiconductor device along a width of the source region.

\* \* \* \* \*